United States Patent
Ning (10) Patent No.: US 7,820,500 B2
(45) Date of Patent: Oct. 26, 2010

(54) SINGLE MASK SCHEME METHOD AND STRUCTURE FOR INTEGRATING PMOS AND NMOS TRANSISTORS USING STRAINED SILICON

(75) Inventor: Xian J. Ning, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 118 days.

(21) Appl. No.: 11/471,071

(22) Filed: Jun. 19, 2006

(65) Prior Publication Data

US 2007/0096201 A1  May 3, 2007

(30) Foreign Application Priority Data

Oct. 31, 2005  (CN) .......................... 2005 1 0110071

(51) Int. Cl.
H01L 21/8238 (2006.01)
(52) U.S. Cl. .................... 438/199; 438/197; 438/230; 257/E21.632; 257/E21.634; 257/E21.636
(58) Field of Classification Search ............... 438/153, 438/154, 179, 180, 184, 188, 197, 199, 223–230; 257/E21.63–E21.644, 369
See application file for complete search history.

(56) References Cited

U.S. PATENT DOCUMENTS

| 6,372,569 B1 * | 4/2002 | Lee et al. ..................... 438/229 |
| 6,483,151 B2 * | 11/2002 | Wakabayashi et al. ...... 257/369 |
| 6,617,623 B2 * | 9/2003 | Rhodes ........................ 257/215 |
| 6,713,357 B1 * | 3/2004 | Wang et al. .................. 438/287 |
| 6,891,192 B2 * | 5/2005 | Chen et al. ..................... 257/49 |
| 7,547,595 B2 * | 6/2009 | Ning ............................ 438/199 |
| 2003/0139001 A1 * | 7/2003 | Snyder et al. ................ 438/197 |
| 2005/0035409 A1 * | 2/2005 | Ko et al. ...................... 257/350 |
| 2005/0158931 A1 | 7/2005 | Chen et al. |
| 2006/0086987 A1 * | 4/2006 | Chen et al. .................. 257/369 |
| 2007/0184668 A1 * | 8/2007 | Ning et al. .................. 438/752 |

* cited by examiner

FOREIGN PATENT DOCUMENTS

CN  1499578  5/2004

*Primary Examiner*—Ha Tran T Nguyen
*Assistant Examiner*—Daniel Whalen
(74) *Attorney, Agent, or Firm*—Townsend and Townsend and Crew LLP (57) ABSTRACT

A method for forming a CMOS integrated circuit using strained silicon technology. The method forms a liner layer overlying the first gate structure and the second gate structure and overlying first source/drain regions in the first well region and second source/drain regions in the second well region. In a preferred embodiment, the method patterns A spacer dielectric layer to form first sidewall spacer structures on the first gate structure, including the first edges and to form the second sidewall spacer structures on the second gate structure, including the second edges, while using a portion of the liner layer as a stop layer. The method maintains the liner layer overlying the first source/drain regions and second source/drain regions during at least the patterning of the spacer dielectric layer according to a preferred embodiment. The method also etches a first source region and a first drain region adjacent to the first gate structure using the hard mask layer and the first sidewall spacers as a protective layer. The method deposits a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region.

20 Claims, 8 Drawing Sheets

SINGLE MASK SCHEME METHOD AND STRUCTURE FOR INTEGRATING PMOS AND NMOS TRANSISTORS USING STRAINED SILICON

CROSS-REFERENCES TO RELATED APPLICATIONS

The present application claims priority to PRC Patent Application No. 200510110071.8, filed Oct. 31, 2005, commonly assigned, and hereby incorporated by reference for all purposes.

The present application relates to U.S. Ser. No. 11/244,955, commonly assigned, and hereby incorporated by reference for all purposes.

BACKGROUND OF THE INVENTION

The present invention is directed to integrated circuits and their processing for the manufacture of semiconductor devices. More particularly, the invention provides a method and structures for integrating PMOS and NMOS devices using strained silicon structures for advanced CMOS integrated circuit devices. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of MOS devices itself. Such device has traditionally became smaller and smaller and produced faster switching speeds. Although there have been significant improvements, such device designs still have many limitations. As merely an example, these designs must become smaller and smaller but still provide clear signals for switching, which become more difficult as the device becomes smaller. Additionally, these designs are often difficult to manufacture and generally require complex manufacturing processes and structures. These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for integrating PMOS and NMOS devices using strained silicon structures for advanced CMOS integrated circuit devices. But it would be recognized that the invention has a much broader range of applicability.

As further background information, integrated circuit processes involves gate patterning, which is normally using poly crystalline silicon as a gate conductor. A polysilicon film is deposited on the substrate, which is single crystal silicon that has undergone various processes such as implantations, gate oxide formation, among others. The polysilicon is then covered with dielectric materials such as silicon oxide and/or silicon oxynitride. This dielectric film is then photo lithographically patterned and etched to form the gate conductor pattern. The patterned dielectric materials is then used as "hard mask" to transfer the pattern into the polysilicon using plasma etching processes. The dielectric spacer is then formed by chemical vapor deposition ("CVD") deposition of $SiO_2$ and/or $SiN_x$ followed by plasma etch back.

As critical dimension become smaller, epitaxial growth of silicon germanium ("SiGe") in recessed source and drains regions have been used in CMOS technology to improve the mobility of PMOS transistors. A $SiN_x$ plasma enhanced chemical vapor deposition ("PECVD") film with tensile stress was used as contact etch-stop layer to improve the mobility of NMOS. Although there have been a variety of improvements, we have discovered a method and structure that only uses one additional mask to integrate SiGe for PMOS and tensile PECVD SiN for NMOS devices in these advanced integrated circuit devices. Further details of our method and structure can be found throughout the present specification and more particularly below.

In a specific embodiment, the present invention provides a method for forming a semiconductor integrated circuit device, e.g., CMOS. The method includes providing a semiconductor substrate (e.g., silicon, silicon on insulator, epitaxial silicon) including a first well region (e.g., N-type well) and a second well region, e.g., P-type well. The method includes forming a dielectric layer (e.g., silicon dioxide, silicon nitride, silicon oxynitride) overlying the semiconductor substrate including the first well region and the second well region. The method forms a polysilicon gate layer (e.g., doped polysilicon, insitu-doped polysilicon, amorphous silicon, which is crystallized) overlying the dielectric layer. In a preferred embodiment, the polysilcon gate layer is overlying a first channel region in the first well region and a second channel region in the second well region in the semiconductor substrate. The method forms a hard mask (e.g., dielectric layer) overlying the polysilicon gate layer. In a specific embodiment, the method patterns the polysilicon gate layer, including the hard mask layer, to form a first gate structure including first edges in the first well region and a second gate structure including second edges in the second well region.

In a preferred embodiment, the method forms a liner layer overlying the first gate structure and the second gate structure and overlying first source/drain regions in the first well region and second source/drain regions in the second well region. The method forms a spacer dielectric layer overlying the liner layer. In a preferred embodiment, the method patterns the spacer dielectric layer to form first sidewall spacer structures on the first gate structure, including the first edges and to form the second sidewall spacer structures on the second gate structure, including the second edges, while using a portion of the liner layer as a stop layer. The method maintains the liner layer overlying the first source/drain regions and second source/drain regions during at least the patterning of the spacer dielectric layer according to a preferred embodiment. The method protects the second well region including the second gate structure using a masking layer. The method also etches a first source region and a first drain region adjacent to the first gate structure using the hard mask layer and the first sidewall spacers as a protective layer. The method deposits a silicon germanium fill material into the first source region and the first drain region to fill the etched first source region and the etched first drain region while causing the first channel region between the first source region and the first drain region to be strained in compressive mode from at least the silicon germanium material formed in the first source region and the first drain region.

In a specific embodiment, the present invention provides a method for forming a semiconductor integrated circuit device, e.g., CMOS. The method includes providing a semiconductor substrate (e.g., silicon, silicon on insulator, epitaxial silicon) including a first well region (e.g., N-type well) and a second well region, e.g., P-type well. The method includes forming a dielectric layer (e.g., silicon dioxide, silicon nitride, silicon oxynitride) overlying the semiconductor substrate including the first well region and the second well region. The method forms a polysilicon gate layer (e.g., doped polysilicon, insitu-doped polysilicon, amorphous silicon, which is crystallized) overlying the dielectric layer. In a preferred embodiment, the polysilcon gate layer is overlying a first channel region in the first well region and a second channel region in the second well region in the semiconductor substrate. The method forms a hard mask (e.g., dielectric layer) overlying the polysilicon gate layer. The method patterns the polysilicon gate layer, including the hard mask layer, to form a first gate structure including first edges in the first well region and a second gate structure including second edges in the second well region.

In a preferred embodiment, the method forms a liner layer overlying the first gate structure and the second gate structure and overlying first source/drain regions in the first well region and second source/drain regions in the second well region. In a preferred embodiment, the liner layer comprises a TEOS material. The method forms a spacer dielectric layer overlying the liner layer. The method includes patterning the spacer dielectric layer to form first sidewall spacer structures on the first gate structure, including the first edges and to form the second sidewall spacer structures on the second gate structure, including the second edges, while using a portion of the liner layer as a stop layer. The method maintains the liner layer overlying the first source/drain regions and second source/drain regions during at least the patterning of the spacer dielectric layer. The method protects the second well region including the second gate structure using a masking layer overlying the second well region. The method etches a first source region and a first drain region adjacent to the first gate structure using the hard mask layer and the first sidewall spacers as a protective layer. The method strips the masking layer overlying the second well region while exposing a portion of the liner layer overlying the second well region. A step of selectively depositing a silicon germanium fill material into the first source region and the first drain region to fill the etched first source region and the etched first drain region while using the portion of the liner layer overlying the second well region as a masking material is included. In a preferred embodiment, the silicon germanium fill material causes the first channel region between the first source region and the first drain region to be strained in compressive mode from at least the silicon germanium material formed in the first source region and the first drain region.

Depending upon the embodiment, one or more of these features may exist.

1. In a specific embodiment, the present method and structure includes a spacer etch process that stops on a liner layer, e.g., tetraethylorthosilicate, commonly called "TEOS." The spacer can be made of a variety of materials including silicon dioxide/silicon nitride, silicon dioxide/silicon nitride/silicon dioxide, or silicon dioxide only, in the later case, the spacer etch will be a partial etch. In a specific embodiment, the TEOS has a thickness of about 100 to 150 Angstroms and greater.

2. The present method and structure can use a photo mask pattern to cover the NMOS regions, while stripping TEOS using dry etching or wet etching, and also while using self-aligned poly hard mask and spacer to pattern the PMOS source and drain recess etch according to a specific embodiment. The recess etch leaves the spacer for SiGe epitaxial growth for strained silicon according to a specific embodiment.

3. In a specific embodiment, the lining TEOS in NMOS region can be used as mask for SiGe epitaxial growth.

4. In an alternative specific embodiment, the lining TEOS in NMOS region is stripped together with poly hard mask in order for silicide formation on exposed silicon regions, e.g., gate structure.

Depending upon the embodiment, one or more of these features can exist. Of course, there can be other variations, modifications, and alternatives.

Many benefits are achieved byway of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 90 nanometers and less. Additionally, the invention provides for increased mobility of holes using a strained silicon structure for CMOS devices. In a preferred embodiment, the present invention provides an improved method for manufacturing CMOS devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques for processing integrated circuits for the manufacture of semiconductor devices are provided. More particularly, the invention provides a method and structures for integrating PMOS and NMOS devices using strained silicon structures for advanced CMOS integrated circuit devices. But it would be recognized that the invention has a much broader range of applicability.

Figure 1:
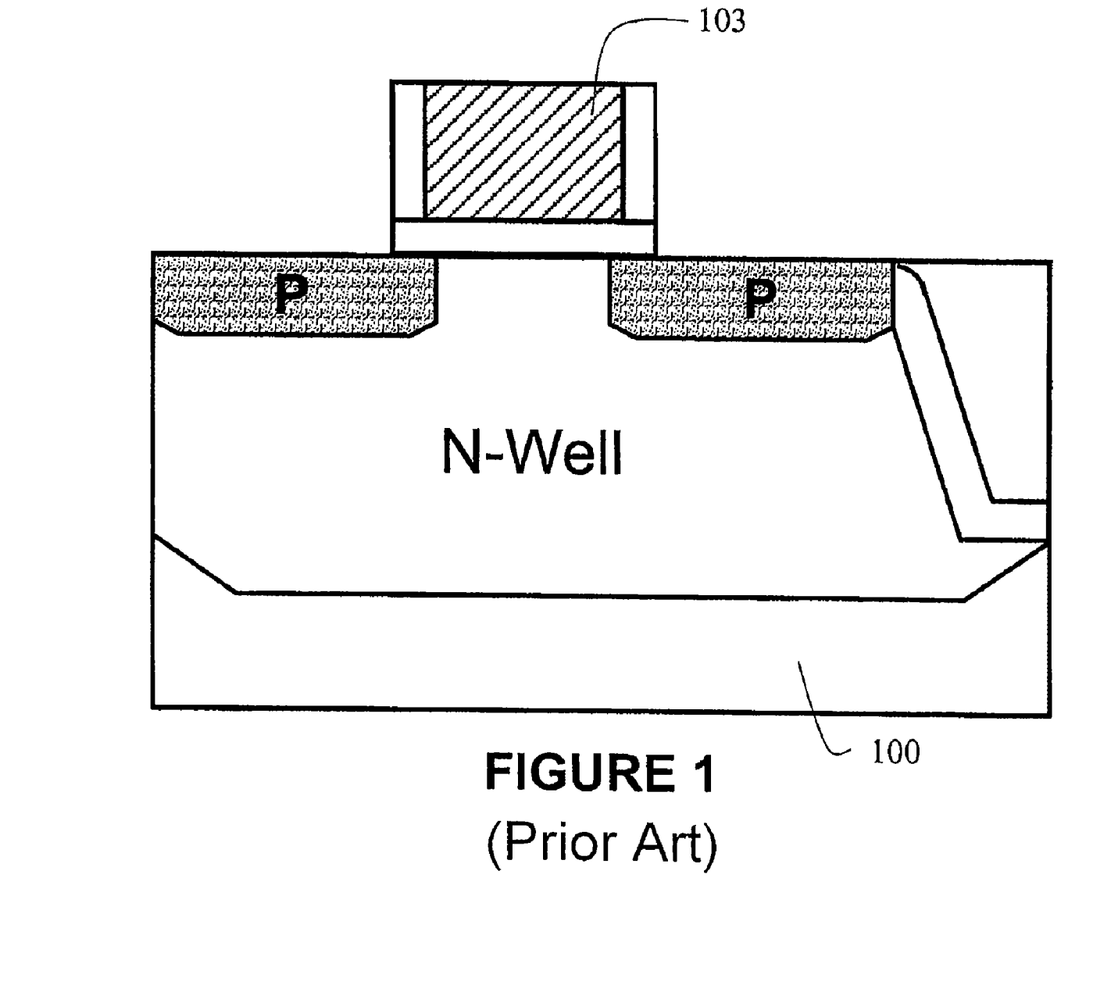
FIGS. 1 through 3 are simplified cross-sectional view diagrams illustrating a conventional method for fabricating a strained silicon MOS device.
Figure 2:
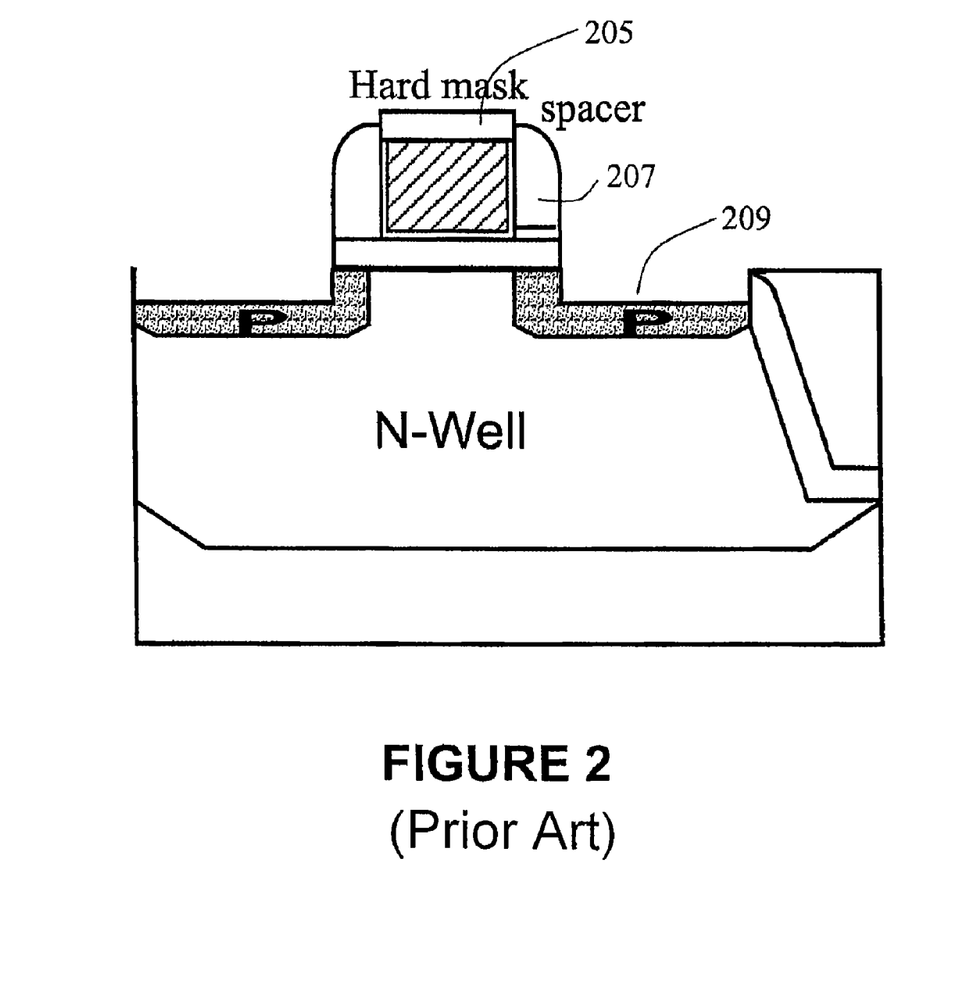
Figure 3:
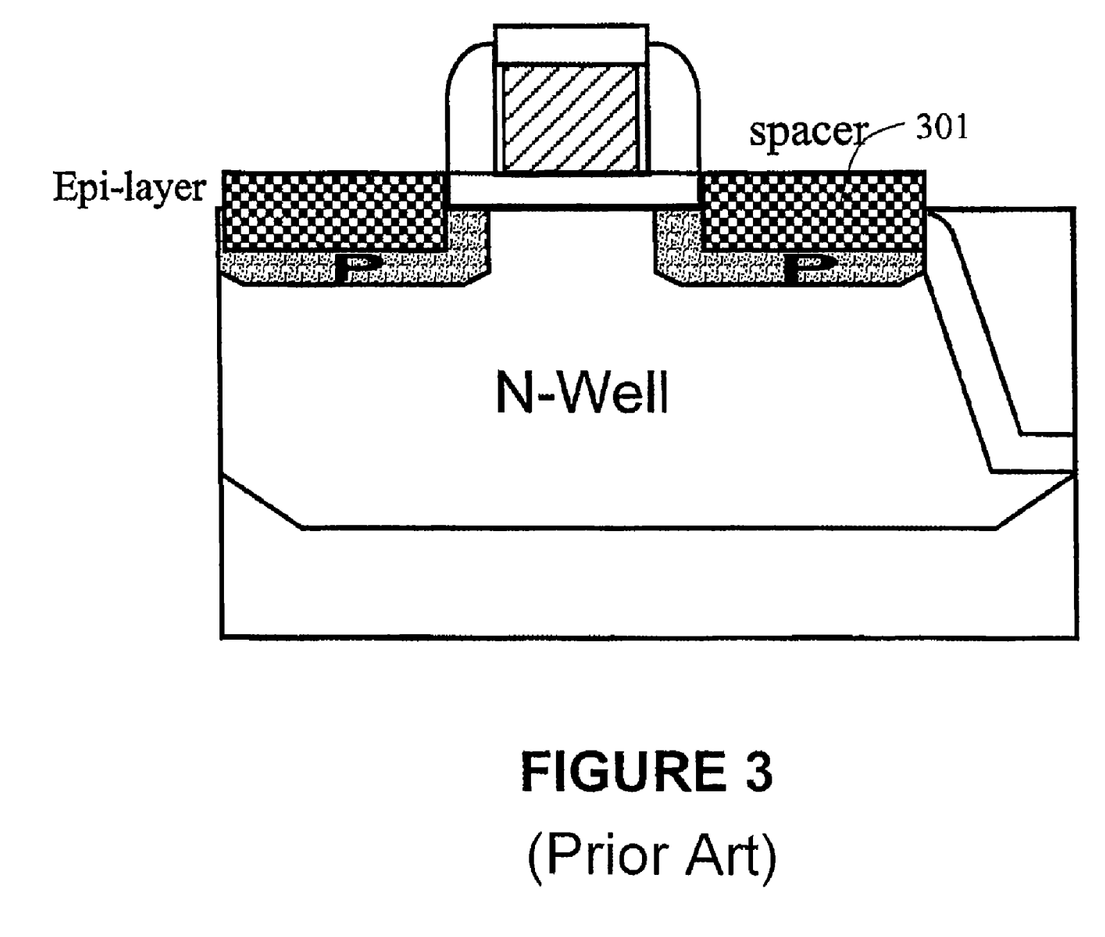

FIGS. 1 through 3 are simplified cross-sectional view diagram of conventional methods for fabricating a strained silicon MOS device. Referring to FIGS. 1 through 3, a conventional process sequence has been reproduced below.

1. Provide a silicon substrate (100);
2. Form gate layer (103);
3. Form dielectric hard mask (205);
4. Pattern dielectric mask;
5. Pattern gate layer to form polysilicon gates;
6. Deposit spacer layer and etch back to form spacer structures 207;
7. Etch source/drain recessed regions 209 in silicon;
8. Form epitaxial silicon/germanium 301 in recessed regions;
9. Remove hard mask; and
10. Perform other steps as desired.

As noted above, the NMOS device is often made using the above process steps. As the device becomes more complex and line rules become smaller, it is more difficult to manufacture the NMOS device for CMOS technologies. These and other limitations may be overcome by the present method and structures, which will be described in more detail below.

Figure 4:
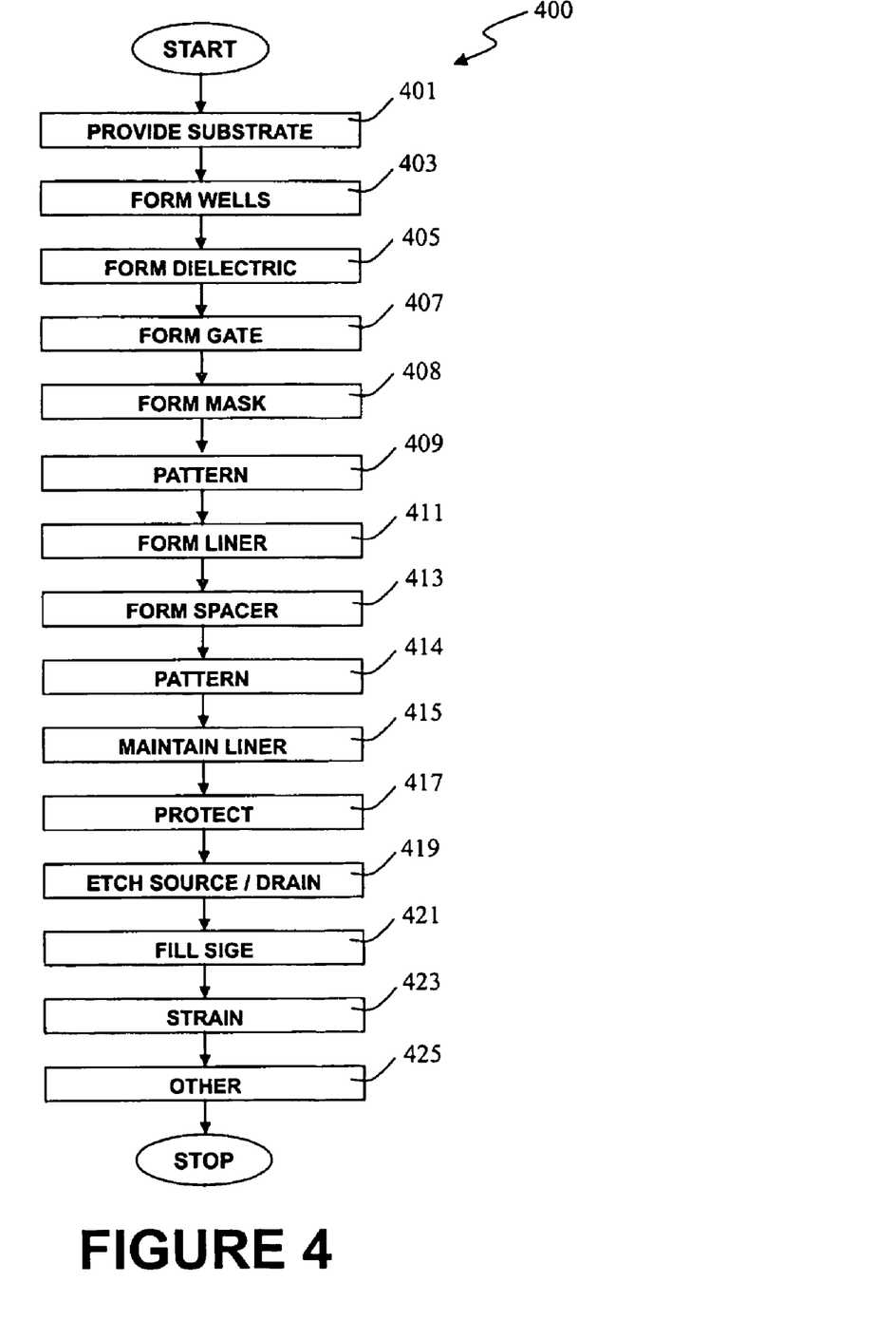
FIG. 4 is a simplified flow diagram illustrating a method for forming a strained silicon device according to an embodiment of the present invention.

A method 400 for fabricating an integrated circuit device according to an embodiment of the present invention may be outlined as follows (see FIG. 4):

1. Provide a semiconductor substrate (e.g., silicon, silicon on insulator, epitaxial silicon) (step 401);
2. Form (step 403) a first well region (e.g., N-type well) and a second well region, e.g., P-type well in the semiconductor substrate;
3. Form a dielectric layer (step 405) (e.g., silicon dioxide, silicon nitride, silicon oxynitride) overlying the semiconductor substrate including the first well region and the second well region;
4. Form a polysilicon gate layer (step 407) (e.g., doped polysilicon, insitu-doped polysilicon, amorphous silicon, which is crystallized) overlying the dielectric layer;
5. Form a hard mask (step 408) (e.g., dielectric layer) overlying the polysilicon gate layer;
6. Pattern the polysilicon gate layer (step 409), including the hard mask layer, to form a first gate structure including first edges in the first well region and a second gate structure including second edges in the second well region;
7. Form (step 411) a liner layer (e.g., TEOS) overlying the first gate structure and the second gate structure and overlying first source/drain regions in the first well region and second source/drain regions in the second well region;
8. Form a spacer dielectric layer (step 413) overlying the liner layer;
9. Pattern the spacer dielectric layer (step 414) to form first sidewall spacer structures on the first gate structure, including the first edges and to form the second sidewall spacer structures on the second gate structure, including the second edges, while using a portion of the liner layer as a stop layer;
10. Maintain the liner layer (step 415) overlying the first source/drain regions and second source/drain regions during at least the patterning of the spacer dielectric layer according to a preferred embodiment;
11. Protect (step 417) the second well region including the second gate structure using a masking layer;
12. Etch a first source region and a first drain region (step 419) adjacent to the first gate structure using the hard mask layer and the first sidewall spacers as a protective layer;
13. Deposit a silicon germanium fill material (step 421) into the first source region and the first drain region to fill the etched first source region and the etched first drain region;
14. Cause the first channel region between the first source region and the first drain region to be strained (step 423) in compressive mode from at least the silicon germanium material formed in the first source region and the first drain region; and
15. Perform other steps (step 425), as desired.

The above sequence of steps provides a method according to an embodiment of the present invention. As shown, the method uses a combination of steps including a way of forming an integrated circuit device such as an MOS device for a CMOS integrated circuit. As shown, the method includes using a liner layer to facilitate the manufacture of both NMOS and PMOS devices in the CMOS integrated circuit device according to a specific embodiment. Other alternatives can also be provided where steps are added, one or more steps are removed, or one or more steps are provided in a different sequence without departing from the scope of the claims herein. Further details of the present method can be found throughout the present specification and more particularly below.

FIGS. 5 through 8 are simplified cross-sectional view diagrams illustrating a method for fabricating a strained silicon CMOS device according to an embodiment of the present invention. These diagrams are merely examples, which should not unduly limit the scope of the claims herein. One of ordinary skill in the art would recognize many variations, alternatives, and modifications. As shown, the present method illustrates a semiconductor integrated circuit device, e.g., CMOS, including PMOS 510 and NMOS 520 device regions. The method includes providing a semiconductor substrate 501, e.g., silicon, silicon on insulator, epitaxial silicon. The method includes forming a first well region 503 (e.g., N-type well) and a second well region 505, e.g., P-type well. Field isolation oxide regions, including shallow trench isolation oxide 507, is provided between active regions on the substrate. Of course, there can be other variations, modifications, and alternatives.

Figure 5:
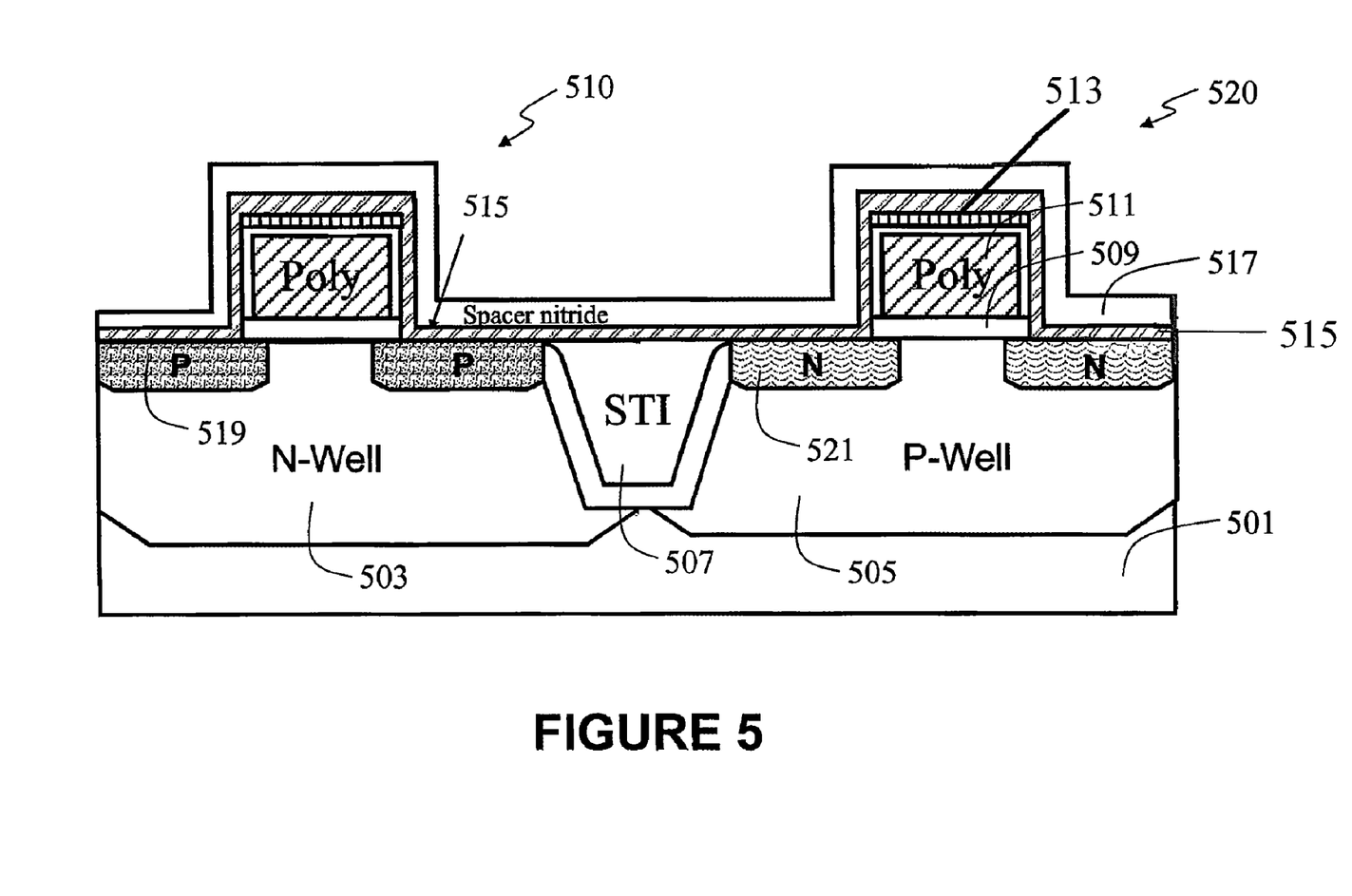
FIGS. 5 through 8 are simplified cross-sectional view diagrams illustrating a method for fabricating a strained silicon CMOS device according to an embodiment of the present invention.

In a specific embodiment, the method includes forming a dielectric layer 509 (e.g., silicon dioxide, silicon nitride, silicon oxynitride) overlying the semiconductor substrate including the first well region and the second well region. The method forms a polysilicon gate layer 511 overlying the dielectric layer. In a preferred embodiment, the polysilicon gate layer is overlying a first channel region in the first well region and a second channel region in the second well region in the semiconductor substrate. In a specific embodiment, the first channel region and the second channel region are characterized by a channel length of 65 nm and less. The polysilicon can be made using a suitable technique including doped polysilicon, insitu-doped polysilicon, and/or amorphous silicon, which is crystallized. Of course, there can be other variations, modifications, and alternatives.

In a specific embodiment, the method forms a hard mask 513 overlying the polysilicon gate layer. The hard mask is often made of a suitable material such as silicon dioxide, silicon nitride, combinations of these, and others. In a specific embodiment, the hard mask can have a thickness ranging from about 200 Angstroms to about 400 Angstroms. The method patterns the polysilicon gate layer, including the hard mask layer, to form a first gate structure including first edges in the first well region and a second gate structure including second edges in the second well region. As shown, the first gate structure corresponds to the PMOS device region 510 and the second gate structure corresponds to the NMOS device region 520. The PMOS device region also includes lightly doped regions 519, which are often provided by implanting and/or other suitable techniques. The NMOS device region also includes lightly doped regions 521, which are often provided by implanting and/or other suitable techniques.

In a preferred embodiment, the method forms a liner layer 515 overlying the first gate structure and the second gate structure and overlying first source/drain regions in the first well region and second source/drain regions in the second well region. In a preferred embodiment, the liner layer comprises a TEOS material and/or other suitable materials, depending upon the embodiment. In a preferred embodiment, the TEOS layer has a thickness of about 100 Angstroms or greater or 150 Angstroms or greater to be a suitable liner. The TEOS can be deposited using suitable techniques such as chemical vapor deposition, atmospheric chemical vapor deposition, and the like. Of course, the particular thickness will depending upon the specific embodiment, among other factors. In a preferred embodiment, the liner layer encloses an entirety of the surface region of the NMOS and PMOS devices regions, including source/drain regions, gate structures, isolation structures, and other exposed surface regions. Of course, there can be other variations, modifications, and alternatives.

Figure 6:
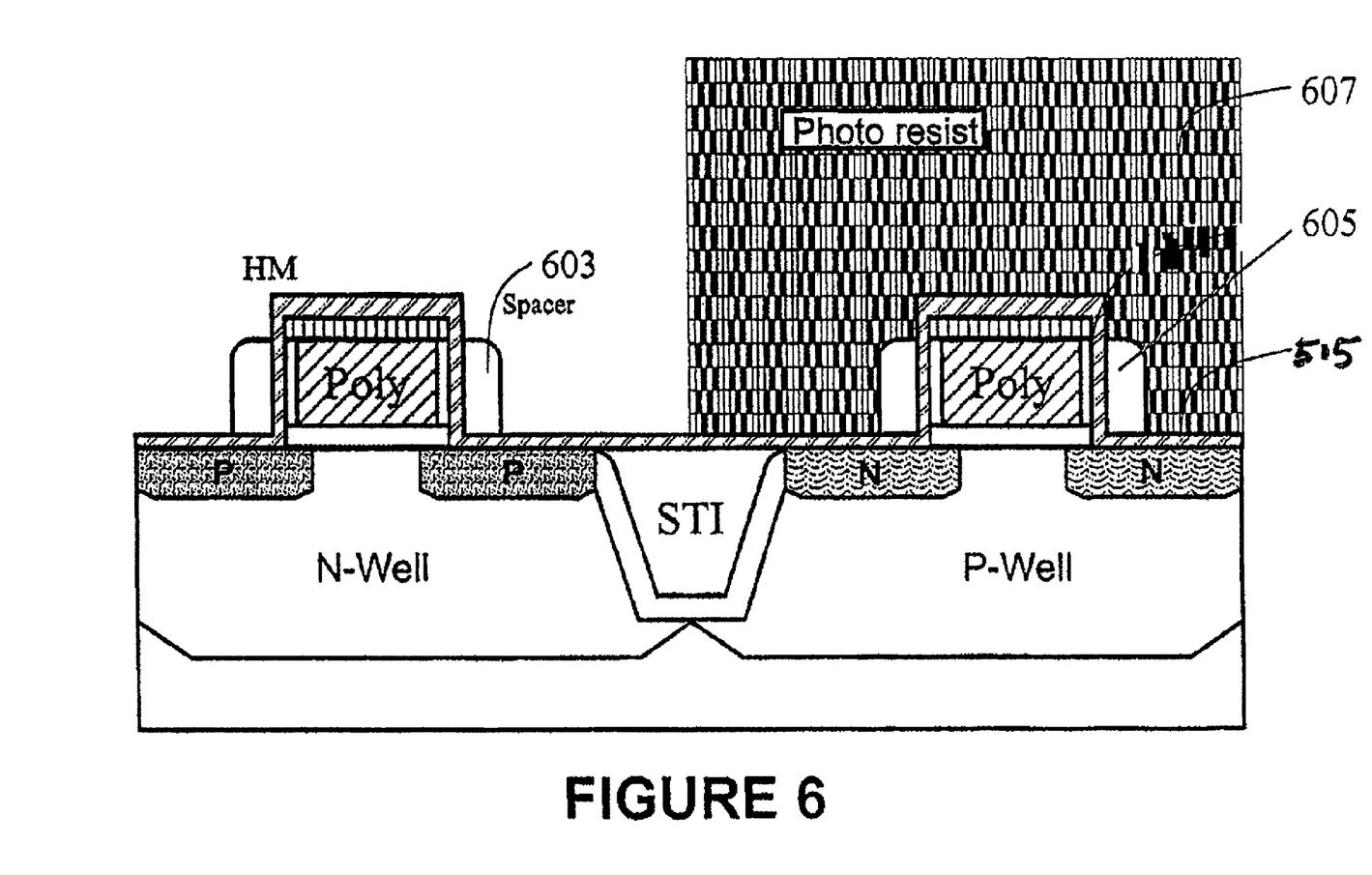

In a specific embodiment, the method forms a spacer dielectric layer 517 overlying the liner layer, as illustrated by the simplified diagram of FIG. 5. Referring to FIG. 6, the method includes patterning the spacer dielectric layer to form first sidewall spacer structures 603 on the first gate structure, including the first edges and to form the second sidewall spacer structures 605 on the second gate structure, including the second edges, while using a portion of the liner layer 515 as a stop layer. The spacer dielectric layer can be an oxide, a nitride, a silicon oxide/silicon nitride/silicon oxide combination, a silicon oxide/silicon nitride combination, or other suitable materials of sufficient thickness. The spacer dielectric layer is also substantially pinhole free according to preferred embodiments. The spacer dielectric layer is preferably less than 300 Angstroms in preferred embodiments. Of course, there can be other variations, modifications, and alternatives.

In a preferred embodiment, the method maintains the liner layer 601 overlying the first source/drain regions and second source/drain regions during at least the patterning of the spacer dielectric layer, referring again to the simplified diagram of FIG. 6. The method protects the second well region including the second gate structure using a masking layer 607 overlying the second well region. As shown, the masking layer can be any suitable photolithographic material, such as photo resist and/or other like materials according to a specific embodiment. As shown, the masking material protects the NMOS device region including a portion of the shallow trench isolation, which separates the NMOS region from the PMOS region according to a specific embodiment.

Now, the method etches a first source region and a first drain region adjacent to the first gate structure using the hard mask layer overlying the first gate structure and the first sidewall spacers as a protective layer. A portion of the liner layer overlying the PMOS device region and portion of the shallow trench isolation is first removed, prior to etching of the first source region and the first drain region. Etching occurs in the first source/drain regions, which are substantially silicon based, while other portions of dielectric material act as masking materials according to a specific embodiment. Etching occurs using a plasma etch process to form the recessed regions. Next, the method strips the masking layer overlying the second well region while exposing a portion of the liner layer overlying the second well region.

Figure 7:
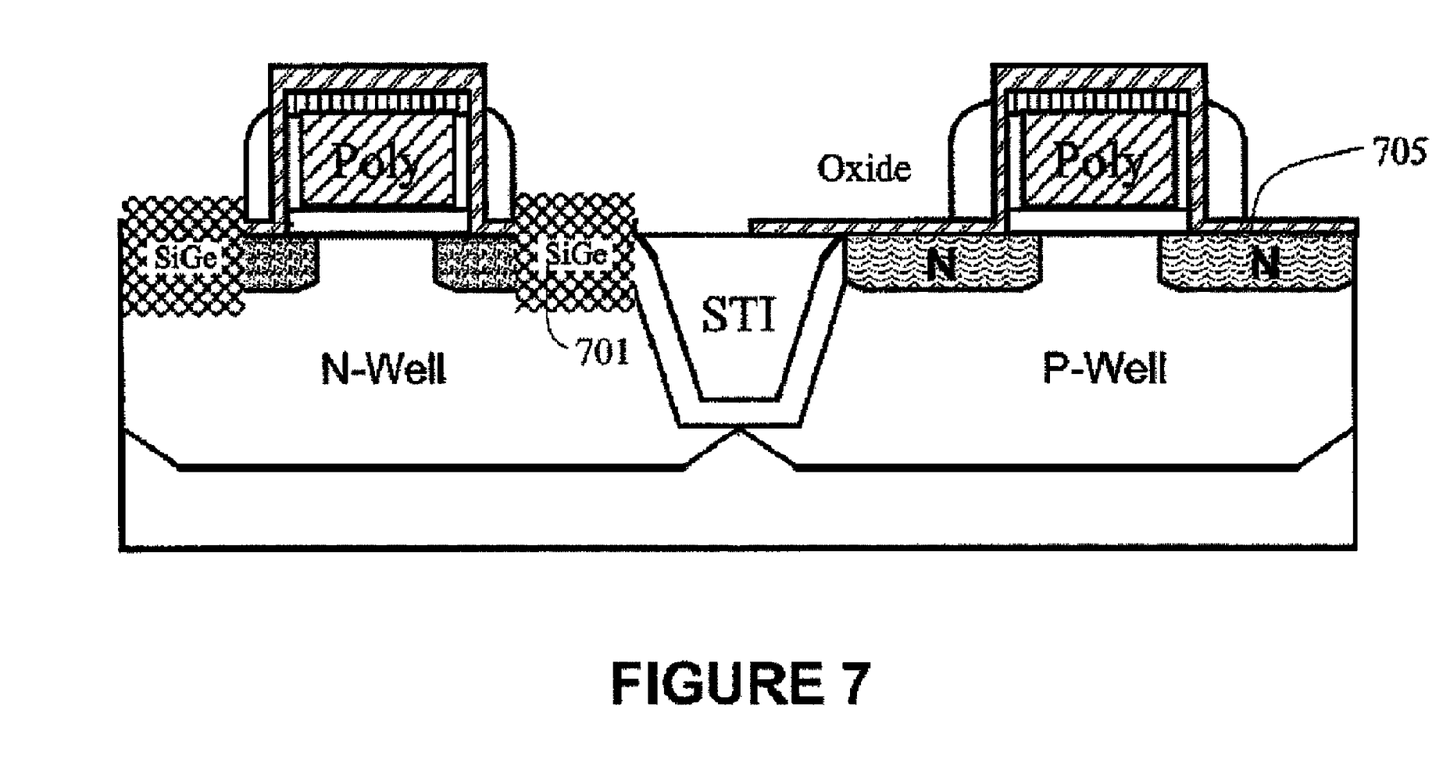

Referring to FIG. 7, the method selectively deposits a silicon germanium fill material 701 into the first source region and the first drain region to fill the etched first source region and the etched first drain region according to a specific embodiment. In a preferred embodiment, the deposition of silicon germanium fill material occurs while using the portion 705 of the liner layer overlying the second well region as a masking material. In a preferred embodiment, the silicon germanium fill material causes the first channel region between the first source region and the first drain region to be strained in compressive mode from at least the silicon germanium material formed in the first source region and the first drain region.

In a preferred embodiment, the method includes a self-aligned silicon recess etch that can include a lining TEOS etch step and single crystal silicon etch step on the PMOS source and drain regions. The method also includes a photo resist strip, and SiGe epitaxial growth. Since the epitaxial growth can only be grown on exposed silicon surfaces, it can only grow on source and drain regions of PMOS, while the other regions of silicon dioxide, silicon nitride, or the like materials remains free from silicon germanium bearing materials according to a specific embodiment.

In a preferred embodiment, the silicon germanium fill material is single crystalline and deposited using an epitaxial reactor. The ratio of silicon/germanium is 10% to 20% according to a specific embodiment. The etched source region and the etched drain region are each coupled to the gate structure. As shown, the device has a strained channel region between the filled source region and the filled drain region from at least the silicon germanium material formed in the etched source region and the etched drain region. The device also has lightly doped drain regions or implant regions, which are formed before growing the silicon/germanium material in the recessed regions. Of course, there can be other variations, modifications, and alternatives.

Figure 8:
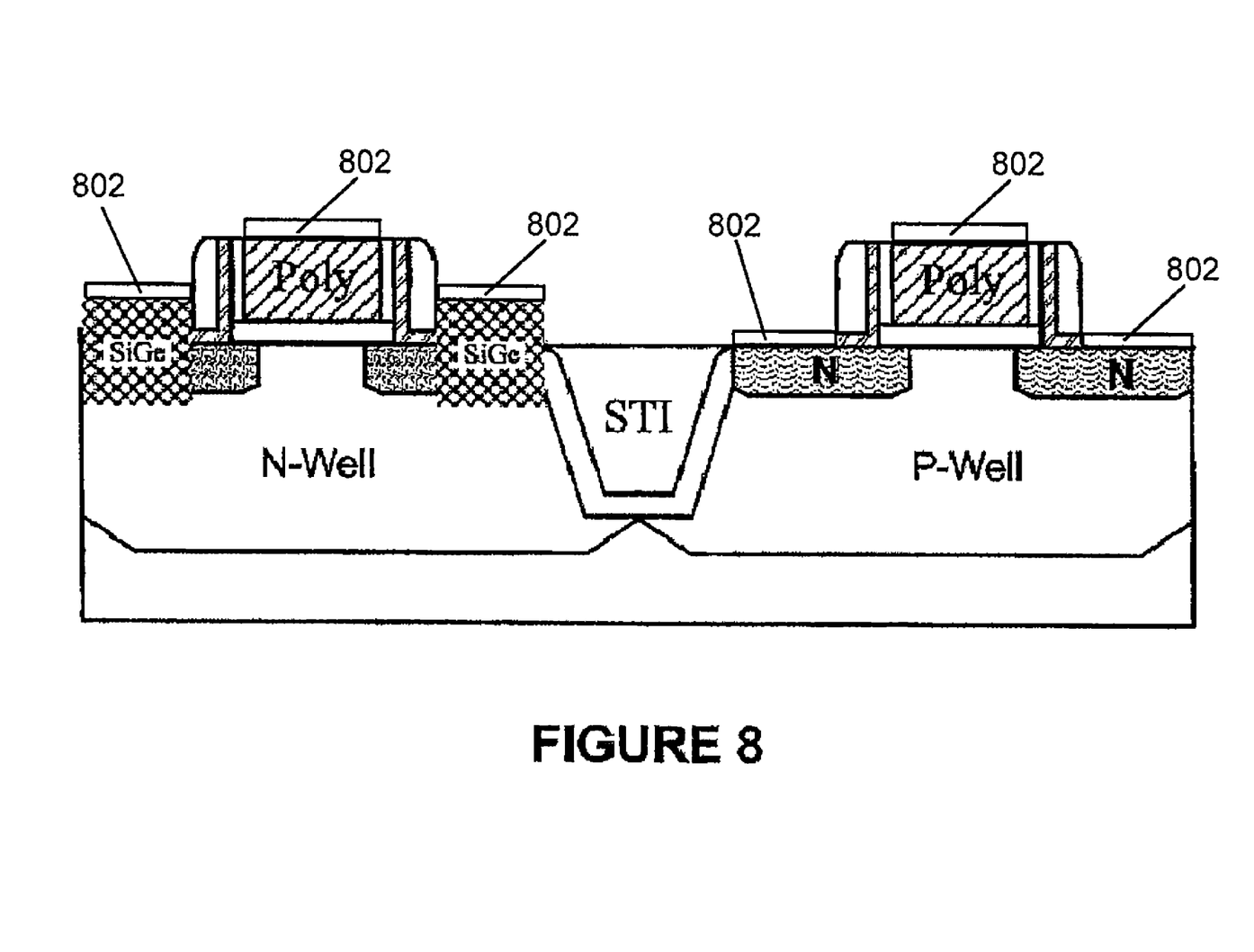

Referring to FIG. 8, the method strips any remaining portion of the liner layer according to a specific embodiment. Concurrent with the liner layer, the method strips the hard mask material, which can be selectively removed from the polysilicon gate structures. Depending upon the embodiment, a silicided material 802 (e.g., titanium, tungsten, cobalt, nickel, platinum, and others) can be provided overlying the polysilicon gate structure, as well as other active portions, e.g., source/drain regions, of the PMOS and NMOS device structures.

In a preferred embodiment, a silicide block layer can be formed by deposition of a $SiO_2$ film and selectively removed of the silicon dioxide layer by photo mask pattern and etch if desired. In a specific embodiment, the method includes a self-aligned silicidation process carried out by deposition of certain refractory metals such as nickel (Ni), cobalt (Co), titanium (Ti) and others, for example, followed by a titanium nitride (TiN) cap layer, as merely an example. In a specific embodiment, the method includes a rapid thermal anneal (RTA) carried out followed by a wet strip removing any unreacted metals. A second RTA can then be applied to complete the silicide phase transformation according to a specific embodiment. A $SiN_x$ film with high tensile stress is then deposited on the the structures by plasma enhanced chemical vapor deposition (PECVD), for example, or other suitable technique. The silicon nitride film thickness ranges from about 200 Angstroms to 1200 Angstroms and is provided overlying the NMOS devices to cause strain in a tensile mode in the NMOS channel region.

In a specific embodiment, the method also includes forming an interlayer dielectric material overlying the entirety of the PMOS and NMOS device structures. In a preferred embodiment, the interlayer dielectric, such as boro-phosphate-silicate-glass (BPSG), boro-silicate glass (BSG), phosphosilicate glass (PSG) or high density plasma (HDP) film is then deposited followed by PECVD oxide layer. Depending upon the specific embodiment, the interlayer dielectric can be a single material, a combination of layers, and the like. The method also includes contact pattern and formation performed to complete the PMOS and NMOS integration on strained silicon. Of course, there can be other variations, modifications, and alternatives.

Although the above has been described in terms of an MOS device, there can be other variations, modifications, and alternatives. It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming a semiconductor integrated circuit device comprising:
   providing a semiconductor substrate including a first well region and a second well region;
   forming a dielectric layer overlying the semiconductor substrate including the first well region and the second well region;
   forming a polysilicon gate layer overlying the dielectric layer, the polysilicon gate layer being overlying a first channel region in the first well region and a second channel region in the second well region in the semiconductor substrate;
   forming a hard mask layer overlying the polysilicon gate layer;
   patterning the polysilicon gate layer, including the hard mask layer, to form a first gate structure including first edges in the first well region and a second gate structure including second edges in the second well region;
   forming a liner layer overlying the first gate structure and the second gate structure and overlying a first source region and a first drain region in the first well region and a second source region and a second drain region in the second well region;
   forming a spacer dielectric layer overlying the liner layer;
   patterning the spacer dielectric layer to form first sidewall spacer structures on the first gate structure and to form second sidewall spacer structures on the second gate structure, the first sidewall spacer structures including the first edges and the second sidewall spacer structures including the second edges;
   maintaining the liner layer overlying the first source region and the first drain region and the second source region and the second drain region during at least the patterning of the spacer dielectric layer;
   etching a portion of each of the first source region and the first drain region adjacent to the first gate structure using the hard mask layer, a first portion of the liner layer, and the first sidewall spacers as a protective layer while protecting the second well region including the second gate structure and the second side wall spacer structures using a masking layer during the etching of the first source region and the first drain region, maintaining at least the second well region un-etched; and
   depositing a silicon germanium fill material into each of the etched first source region and the etched first drain region to fill each of the etched first source region and the etched first drain region and causing the first channel region between the first source region and the first drain region to be strained in compressive mode from at least the silicon germanium material formed in the first source region and the first drain region while at least the second source region and the second drain region are masked by a second portion of the liner layer.

2. The method of claim 1 wherein the dielectric layer is less than 300 Angstroms.

3. The method of claim 1 wherein the second portion of the liner layer further masks a portion of the second well region during deposition of the silicon germanium material.

4. The method of claim 1 wherein the semiconductor substrate is silicon material.

5. The method of claim 1 wherein the silicon germanium material is single crystalline.

6. The method of claim 1 wherein the silicon germanium has a ratio of silicon/germanium of 10% to 20%.

7. The method of claim 1 further comprising removing the hard mask layer and any remaining portion of the liner layer and selectively forming silicide regions overlying the first gate structure, the second gate structure, the first source region, the first drain region, the second source region, and the second drain region.

8. The method of claim 1 wherein the hard mask layer is characterized by a thickness of about 200 to about 400 Angstroms.

9. The method of claim 1 wherein the depositing is provided using an epitaxial reactor.

10. The method of claim 1 wherein the compressive mode increases a mobility of holes in the first channel region.

11. The method of claim 1 wherein the liner layer comprises a TEOS material.

12. The method of claim 1 wherein the spacer dielectric layer comprises an oxide bearing material.

13. The method of claim 1 wherein the spacer dielectric layer comprises an oxide on nitride on oxide material.

14. The method of claim 1 wherein the spacer dielectric layer comprises an oxide on nitride material.

15. The method of claim 1 wherein the liner layer has a thickness of about 100 Angstroms to about 150 Angstroms.

16. A method for forming a semiconductor integrated circuit device comprising:
   providing a semiconductor substrate including a first well region and a second well region;
   forming a dielectric layer overlying the semiconductor substrate including the first well region and the second well region;
   forming a polysilicon gate layer overlying the dielectric layer, the polysilicon gate layer being overlying a first channel region in the first well region and a second channel region in the second well region in the semiconductor substrate;
   forming a hard mask layer overlying the polysilicon gate layer;
   patterning the polysilicon gate layer, including the hard mask layer, to form a first gate structure including first edges in the first well region and a second gate structure including second edges in the second well region;
   forming a liner layer overlying the first gate structure and the second gate structure and overlying a first source region and a first drain region in the first well region and a second source region and a second drain region in the second well region;

forming a spacer dielectric layer overlying the liner layer;

patterning the spacer dielectric layer to form first sidewall spacer structures on the first gate structure and to form second sidewall spacer structures on the second gate structure, the first sidewall spacer structures including the first edges and the second sidewall spacer structures including the second edges;

maintaining the liner layer overlying the first source region and the first drain region and the second source region and the second drain region during at least the patterning of the spacer dielectric layer;

etching the first source region and the first drain region adjacent to the first gate structure using the hard mask layer and the first sidewall spacers as a protective layer while protecting the second well region including the second gate structure and the second side wall spacer structures using a masking layer overlying the second well region at least during the etching of the first source region and the first drain region, maintaining at least the second well region un-etched;

stripping the masking layer overlying the second well region while exposing a portion of the liner layer overlying the second well region;

selectively depositing a silicon germanium fill material into the etched first source region and the etched first drain region to fill the etched first source region and the etched first drain region while using the portion of the liner layer overlying the second well region as a masking material; and causing the first channel region between the first source region and the first drain region to be strained in compressive mode from at least the silicon germanium material formed in the first source region and the first drain region.

17. The method of claim 16 wherein the liner layer comprises a TEOS material.

18. The method of claim 17 wherein the liner layer comprises a thickness ranging from about 100 Angstroms to about 150 Angstroms.

19. The method of claim 17 wherein the first channel region has a length of about 65 nanometers and less.

20. The method of claim 17 wherein the masking layer comprises a photo masking material.

* * * * *